US012765034B2

(12) United States Patent
Okazaki

(10) Patent No.: US 12,765,034 B2
(45) Date of Patent: Oct. 13, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Hiroyuki Okazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 719 days.

(21) Appl. No.: 17/540,097

(22) Filed: Dec. 1, 2021

(65) Prior Publication Data

US 2022/0093762 A1 Mar. 24, 2022

Related U.S. Application Data

(62) Division of application No. 16/608,657, filed as application No. PCT/JP2017/024456 on Jul. 4, 2017, now abandoned.

(51) Int. Cl.
*H10D 64/27* (2025.01)
*H10D 30/01* (2025.01)
(Continued)

(52) U.S. Cl.
CPC ......... *H10D 64/311* (2025.01); *H10D 30/015* (2025.01); *H10D 30/475* (2025.01); *H10D 62/8503* (2025.01); *H10D 64/0124* (2026.01)

(58) Field of Classification Search
CPC ......... H01L 29/42312; H01L 21/28581; H01L 29/2003; H01L 29/66462; H01L 29/7786;
(Continued)

(56) References Cited

U.S. PATENT DOCUMENTS

2007/0138506 A1 6/2007 Braddock
2007/0267652 A1* 11/2007 Amasuga ........... H10D 30/4755 257/E29.127

(Continued)

FOREIGN PATENT DOCUMENTS

JP 2004-103744 A 4/2004
JP 2006-165314 A 6/2006

(Continued)

OTHER PUBLICATIONS

International Search Report issued in PCT/JP2017/024456; mailed Oct. 3, 2017.

(Continued)

*Primary Examiner* — Moin M Rahman
(74) *Attorney, Agent, or Firm* — Studebaker Brackett PLLC

(57) ABSTRACT

An object of the technique disclosed in the Description is to provide a semiconductor device that reduces a gate leakage current without degrading its high-frequency characteristic. A semiconductor device relating to the technique disclosed in the Description includes a nitride semiconductor layer, a first insulating film partly disposed on the upper surface of the nitride semiconductor layer, and a gate electrode provided to have a lower surface that is at least partly in contact with the upper surface of the nitride semiconductor layer that is exposed without being covered with the first insulating film. The first insulating film is provided to be in contact with a side surface of the gate electrode. The first insulating film contains a transition metal.

2 Claims, 7 Drawing Sheets

(51) Int. Cl.

| | |
|---|---|
| ***H10D 30/47*** | (2025.01) |
| ***H10D 62/85*** | (2025.01) |
| ***H10D 64/01*** | (2025.01) |

(58) Field of Classification Search

CPC ............. H01L 23/291; H01L 29/66454; H01L 29/7781; H01L 29/7782; H01L 29/66431; H01L 29/778–7789; H01L 2924/13064; H01L 29/122–127; H01L 29/15–158; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10D 8/60; H10D 8/051; H10D 8/50; H10D 62/8325; H10D 62/8503; H10D 64/01; H10D 64/64; H10D 62/126; H10D 62/60; H10D 62/106; H10D 62/102; H10D 62/12; H10D 64/118; H10D 30/015; H10D 30/475; H10D 62/824; H10D 62/854; H10D 62/117; H10D 62/343; H10D 30/6737; H10D 30/6738; H10D 30/675; H10D 62/85; H10D 64/258; H10D 62/149; H10D 64/256; H10D 84/811; H10D 84/01; H10D 84/05; H10D 84/40; H10D 64/311; H10D 64/0124; H03H 3/08; H03H 9/02976; H03H 2001/0064; H10F 71/1278; H10F 77/1246; H10F 77/146; H10F 77/206; H10F 30/223; H10F 39/10

See application file for complete search history.

(56) References Cited

U.S. PATENT DOCUMENTS

| | | | | |
|---|---|---|---|---|
| 2008/0023744 | A1 | 1/2008 | Shin et al. | |
| 2010/0182250 | A1 | 7/2010 | Kang et al. | |
| 2012/0032305 | A1 | 2/2012 | Kitamura | |
| 2012/0074426 | A1* | 3/2012 | Ohki | H01L 29/7787 257/76 |
| 2014/0319582 | A1 | 10/2014 | Kinoshita et al. | |
| 2015/0249150 | A1 | 9/2015 | Yamaguchi et al. | |
| 2016/0020313 | A1 | 1/2016 | Wu et al. | |
| 2016/0079066 | A1* | 3/2016 | Takada | H01L 29/452 438/586 |
| 2016/0284830 | A1 | 9/2016 | Shimizu | |
| 2017/0077275 | A1* | 3/2017 | Okazaki | H01L 29/66462 |
| 2021/0043750 | A1* | 2/2021 | Neufeld | H01L 29/4916 |

FOREIGN PATENT DOCUMENTS

| | | | |
|---|---|---|---|
| JP | 2012-043964 | A | 3/2012 |
| JP | 2012-049170 | A | 3/2012 |
| JP | 2012-069978 | A | 4/2012 |
| JP | 2012-209297 | A | 10/2012 |
| JP | 2016-181631 | A | 10/2016 |

OTHER PUBLICATIONS

An Office Action issued by the German Patent and Trade Mark Office on Sep. 7, 2022, which corresponds to German Patent Application No. 112017007723.0 and is related to U.S. Appl. No. 17/540,097; with English language translation.

An Office Action mailed by China National Intellectual Property Administration on Feb. 28, 2023, which corresponds to Chinese Patent Application No. 201780092774.3 and is related to U.S. Appl. No. 17/540,097; with English language translation.

* cited by examiner

SEMICONDUCTOR DEVICE AND METHOD FOR MANUFACTURING SEMICONDUCTOR DEVICE

CROSS-REFERENCE TO RELATED APPLICATIONS

This application is a Divisional of U.S. patent application Ser. No. 16/608,657 filed Oct. 25, 2019, which is the U.S. National Stage of International Application No. PCT/JP2017/024456 filed Jul. 4, 2017, the entire content of which is incorporated herein by reference.

TECHNICAL FIELD

The Description discloses a technique that relates to a semiconductor device and a method for manufacturing the semiconductor device.

BACKGROUND ART

Patent Document 1 (i.e., Japanese Patent Application Laid-Open No. 2006-165314), for instance, discloses a conventional semiconductor device that includes a semiconductor layer that is in contact with a gate electrode. The semiconductor layer has a surface doped with impurities in order to reduce a gate leakage current, improve an OFF breakdown voltage, and prevent frequency dispersion.

Patent Document 2 (i.e., Japanese Patent Application Laid-Open No. 2016-181631), for instance, discloses another conventional semiconductor device that includes an oxide insulating film, i.e., protective film, that is disposed between a semiconductor layer and a gate metal and is formed through impurity doping, in order to prevent a current collapse.

PRIOR ART DOCUMENTS

Patent Documents

Patent Document 1: Japanese Patent Application Laid-Open No. 2006-165314

Patent Document 2: Japanese Patent Application Laid-Open No. 2016-181631

SUMMARY

Problem to be Solved by the Invention

For instance, the semiconductor device disclosed in Patent Document 1 (i.e., Japanese Patent Application Laid-Open No. 2006-165314) includes a nitride semiconductor layer that is formed through impurity doping between the surface of the semiconductor layer and the gate electrode. Such a configuration needs to address fluctuations in a threshold voltage and fluctuations in the concentration of a two-dimensional electron gas, and to control epitaxial selective growth. A desired characteristic hence very probably varies.

Forming the nitrogen semiconductor layer in the above configuration very probably limits the length of a gate or the distance between a source and a drain.

For instance, the semiconductor device disclosed in Patent Document 2 (i.e., Japanese Patent Application Laid-Open No. 2016-181631), which is assumed to be used as a power device, operates in a normally-off mode. In order to prevent a current collapse, this semiconductor device includes the oxide insulating film (i.e., protective film) that is disposed between the semiconductor layer and the gate electrode and is formed through impurity doping.

Forming the oxide insulating film in the above configuration unfortunately involves reduction in a maximum current value or rise in a threshold voltage. When such a semiconductor device is used as a high-frequency application, its characteristics of high efficiency and high output can be lowered.

The technique disclosed in the Description has been made to solve this problem. An object is to provide a semiconductor device that reduces a gate leakage current without degrading its high-frequency characteristic.

Means to Solve the Problem

A first aspect of the technique disclosed in the Description includes a nitride semiconductor layer, a first insulating film partly disposed on an upper surface of the nitride semiconductor layer, and a gate electrode provided to have a lower surface that is at least partly in contact with the upper surface of the nitride semiconductor layer that is exposed without being covered with the first insulating film. The first insulating film is provided to be in contact with a side surface of the gate electrode. The first insulating film contains a transition metal.

A second aspect of the technique disclosed in the Description includes the following: epitaxial-growing a nitride semiconductor layer on a semiconductor substrate; partly forming a first insulating film on an upper surface of the nitride semiconductor layer; forming a gate electrode in such a manner that a lower surface of the gate electrode is at least partly in contact with the upper surface of the nitride semiconductor layer that is exposed without being covered with the first insulating film, and in such a manner that a side surface of the gate electrode is in contact with the first insulating film; and adding a transition metal to the first insulating film.

Effects of the Invention

The first aspect of the technique disclosed in the Description includes the nitride semiconductor layer, the first insulating film partly disposed on the upper surface of the nitride semiconductor layer, and the gate electrode provided to have its lower surface that is at least partly in contact with the upper surface of the nitride semiconductor layer that is exposed without being covered with the first insulating film. The first insulating film is provided to be in contact with the side surface of the gate electrode. The first insulating film contains the transition metal. Such a configuration reduces a gate leakage current without degrading a high-frequency characteristic. To be specific, the transition metal contained in the first insulating film forms surface defects and levels at the interface between the nitride semiconductor layer and the first insulating film, and within the first insulating film near the interface. Holes or electrons are then trapped in the formed surface defects and levels, thereby reducing a gate leakage current.

The second aspect of the technique disclosed in the Description includes the following: epitaxial-growing the nitride semiconductor layer on the semiconductor substrate; partly forming the first insulating film on the upper surface of the nitride semiconductor layer; forming the gate electrode in such a manner that the lower surface of the gate electrode is at least partly in contact with the upper surface of the nitride semiconductor layer that is exposed without being covered with the first insulating film, and in such a manner that the side surface of the gate electrode is in contact with the first insulating film; and adding the transition metal to the first insulating film. Such a configuration reduces a gate leakage current without degrading a high-frequency characteristic. To be specific, the transition metal contained in the first insulating film forms surface defects and levels at the interface between the nitride semiconductor layer and the first insulating film, and within the first insulating film near the interface. Holes or electrons are then trapped in the formed surface defects and levels, thereby reducing a gate leakage current.

These and other objects, features, aspects and advantages of the technique disclosed in the Description will become more apparent from the following detailed description when taken in conjunction with the accompanying drawings.

DESCRIPTION OF EMBODIMENT(S)

Embodiments will be described with reference to the accompanying drawings.

The drawings are schematic. For convenience in description, configurations can be omitted or simplified, as necessary. The mutual relationship between the size and position of configurations shown in different drawings is not necessarily exact, and is subject to change as necessary.

In the following description, like components are denoted by the same signs, and have like names and functions. The description thereof will not be elaborated in some cases in order to avoid redundancy.

In some cases, the following description uses terms meaning particular positions and directions (e.g., "top", "down", "left", "right", "side", "bottom", "front", and "back"). These terms are merely used for easy understanding of what is disclosed in each embodiment, and thus have nothing to do with practical directions.

In the following description, ordinal numbers, such as "first" and "second", are used for facilitating the understanding of the embodiment. The order indicated by these ordinal numbers is thus not restrictive.

First Embodiment

The following describes a semiconductor device and a method for manufacturing the semiconductor device, according to a first embodiment.

<Configuration of Semiconductor Device>

Figure 1:
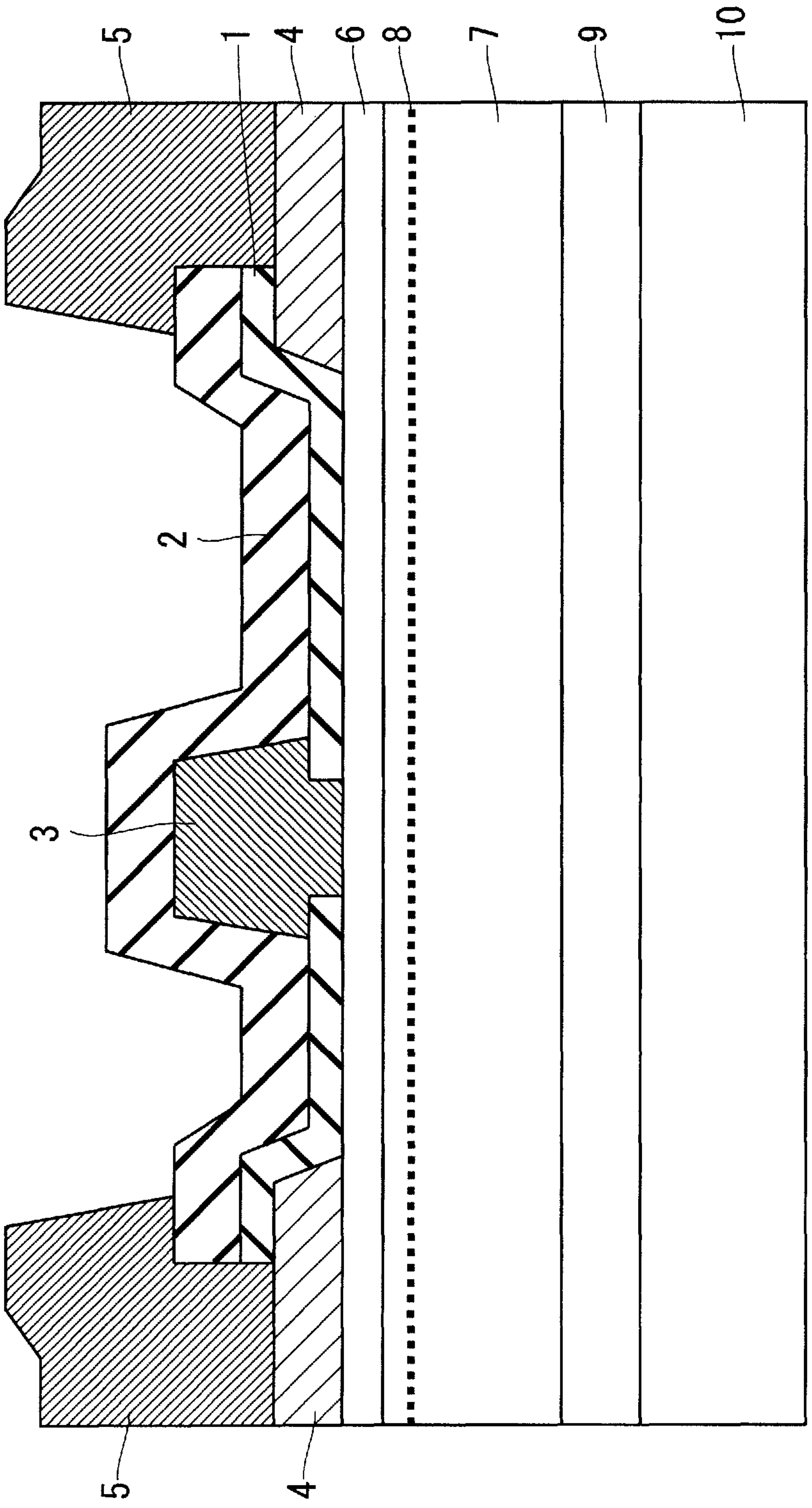
FIG. 1 is a schematic cross-sectional view of an example of the configuration of a field-effect transistor, which is a semiconductor device, according to an embodiment.

FIG. 1 is a schematic cross-sectional view of an example of the configuration of a field-effect transistor, which is a semiconductor device, according to the embodiment. As illustrated in FIG. 1, the field-effect transistor includes a semiconductor substrate 10, a buffer layer 9, a channel layer 7, a barrier layer 6, a plurality of ohmic electrodes 4, an insulating film 1, a Schottky electrode 3, a gate protective film 2, and a wiring electrode 5.

The semiconductor substrate 10 is made of one of Si, SiC, and GaN. The semiconductor substrate 10 desirably has a resistivity of $1\times10^7$ Ωcm or more in order to achieve a good high-frequency characteristic.

The buffer layer 9 is disposed on the upper surface of the semiconductor substrate 10. The buffer layer 9 is an $Al_{1-x}Ga_xN$ ($x\leq1$) nucleus forming layer. The channel layer 7 is disposed on the upper surface of the buffer layer 9. The channel layer 7 is formed by epitaxial-growing GaN. Here, the channel layer 7 in part or in whole may be doped with impurities, such as C or Fe.

The barrier layer 6, composed of a stacked structure of a single composition or multiple compositions, is formed on the upper surface of the channel layer 7. The barrier layer 6 is made of $Al_{1-x}Ga_xN$ ($x\leq1$).

Here, the top layer of the channel layer 7 contains a two-dimensional electron gas layer 8, which is specific to a GaN-HEMT. The GaN-HEMT is a high-electron-mobility transistor (HEMT) made of gallium-nitride-based material, and having a high OFF breakdown voltage and a low gate leakage current.

The ohmic electrodes 4, serving as source electrodes or drain electrodes, are each partly disposed on the upper surface of the barrier layer 6. The ohmic electrodes 4 are each formed through vapor deposition, sputtering, or other processes.

The insulating film 1 extends over the upper surface of the barrier layer 6 and the upper surface of each ohmic electrode 4, and is partly disposed on the upper surface of the barrier layer 6.

The Schottky electrode 3 is partly provided to extend over the upper surface of the insulating film 1 and the upper surface of the barrier layer 6. The Schottky electrode 3 is a gate electrode. The lower surface of the Schottky electrode 3 is provided to be at least partly in contact with the upper surface of the barrier layer 6 that is exposed without being covered with the insulating film 1. Here, the Schottky electrode 3 may be provided to cover only the upper surface of the barrier layer 6. That is, the Schottky electrode 3 does not have to be disposed on the upper surface of the insulating film 1. The Schottky electrode 3 is processed through dry etching or wet etching.

The insulating film 1 is provided so as to be in contact with part of the side surfaces of the Schottky electrode 3, which is a gate electrode, and with the barrier layer 6.

The Schottky electrode 3 is made of two or more metals selected from among Pt, Ti, Ni, Ta, Au, and Al, for instance. It is noted that a metal layer at a location that is in contact with a semiconductor layer is desirably made of one of Pt, Ni, and Ta.

The gate protective film 2 extends over the upper surface of the insulating film 1 and the upper surface of the Schottky electrode 3. The wiring electrode 5 is partly provided to extend over the upper surface of the gate protective film 2 and the upper surface of the ohmic electrode 4.

There are no films, such as an insulating film, disposed immediately under the Schottky electrode 3. The Schottky electrode 3, which is a gate electrode, is disposed immediately on the barrier layer 6. In the configuration illustrated in FIG. 1, the insulating film 1 is interposed between part of the Schottky electrode 3 and part of the barrier layer 6.

The insulating film 1 is in contact with the Schottky electrode 3. The insulating film 1 is also provided to be in contact with the upper surface of the barrier layer 6. The insulating film 1 is an oxide or nitride (e.g., SiN) containing one of elements selected from among Si, Al, Ti, Ta, W, Mo, and Zr for instance.

The insulating film 1 is formed through CVD, sputtering, or atomic layer deposition (ALD). The insulating film 1 contains a 1 wt % or less transition metal, such as Cu, and 1 wt % or less In. It is noted that the metal contained in the insulating film 1 may be Cu only, which is a transition metal.

Here, other possible examples of the transition metal contained in the insulating film 1 include Ni, Zn, Fe, Cr and Ti.

Figure 2:
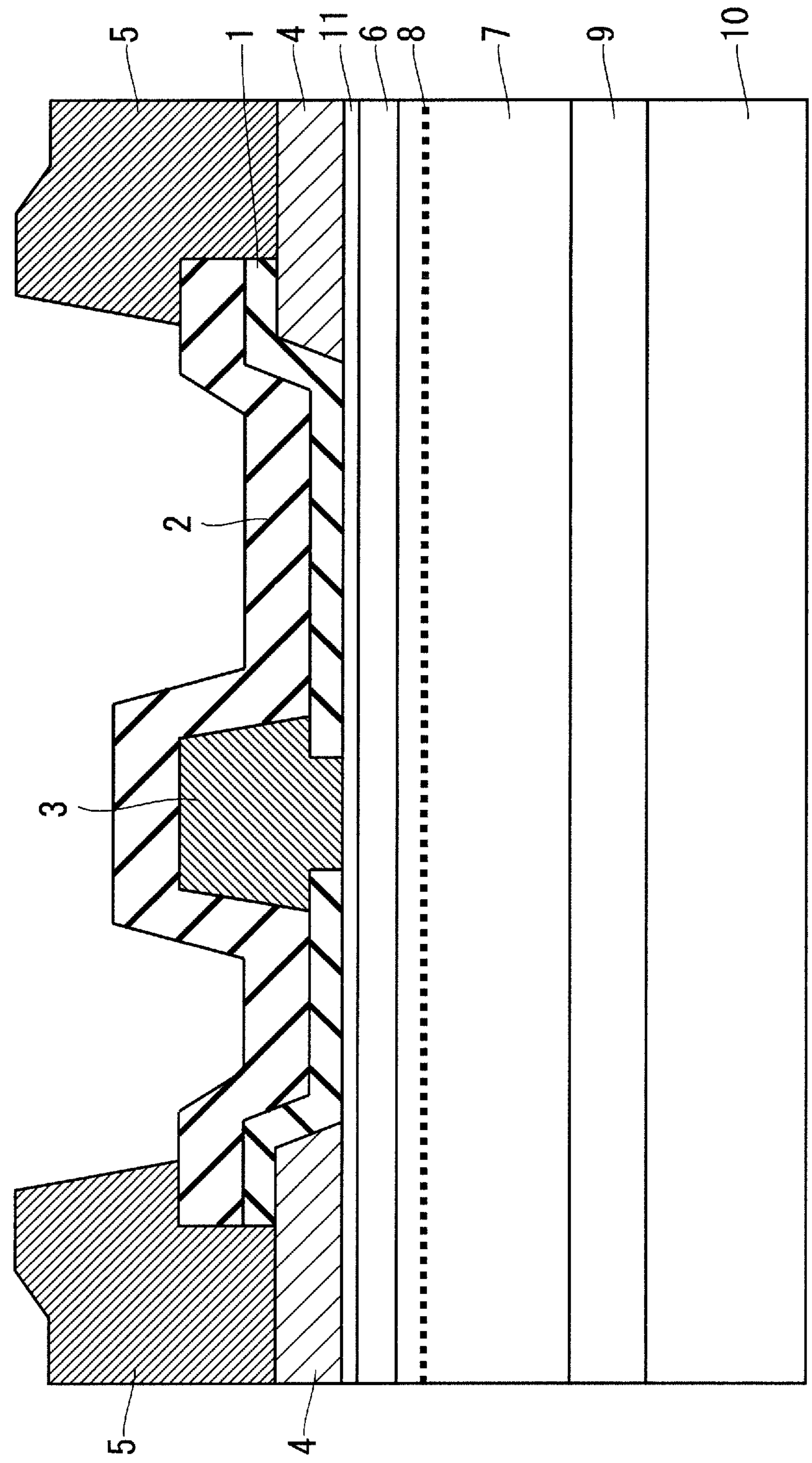
FIG. 2 is a schematic cross-sectional view of another example of the configuration of the field-effect transistor according to the embodiment.

FIG. 2 is a schematic cross-sectional view of another example of the configuration of the field-effect transistor according to the embodiment. As illustrated in FIG. 2, the field-effect transistor includes the semiconductor substrate 10, the buffer layer 9, the channel layer 7, the barrier layer 6, a cap layer 11, the plurality of ohmic electrodes 4, the insulating film 1, the Schottky electrode 3, the gate protective film 2, and the wiring electrode 5.

The barrier layer 6 is disposed on the upper surface of the channel layer 7. The cap layer 11 of GaN is disposed on the upper surface of the barrier layer 6. Here, the thickness of the cap layer 11 is 10 nm or less for instance.

Each of the ohmic electrodes 4 is partly disposed on the upper surface of the cap layer 11. The insulating film 1 extends over the upper surface of the cap layer 11 and the upper surface of each ohmic electrode 4, and is partly disposed on the upper surface of the cap layer 11.

The Schottky electrode 3 is partly provided to extend over the upper surface of the insulating film 1 and the upper surface of the cap layer 11. The lower surface of the Schottky electrode 3 is provided to be at least partly in contact with the upper surface of the cap layer 11 that is exposed without being covered with the insulating film 1. Here, the Schottky electrode 3 may be provided to cover only the upper surface of the cap layer 11. That is, the Schottky electrode 3 does not have to be disposed on the upper surface of the insulating film 1.

Here, the insulating film 1 is provided so as to be in contact with part of the side surfaces of the Schottky electrode 3 and with the cap layer 11.

The gate protective film 2 is provided to extend over the upper surface of the insulating film 1 and the upper surface of the Schottky electrode 3. The wiring electrode 5 is partly provided to extend over the upper surface of the gate protective film 2 and the upper surface of the ohmic electrode 4.

There are no films, such as an insulating film, disposed immediately under the Schottky electrode 3. The Schottky electrode 3, which is a gate electrode, is disposed immediately on the cap layer 11. In the configuration illustrated in FIG. 2, the insulating film 1 is interposed between part of the Schottky electrode 3 and part of the cap layer 11.

The insulating film 1 is in contact with the Schottky electrode 3. The insulating film 1 is disposed on the upper surface of the cap layer 11. The insulating film 1 is an oxide or nitride containing one of elements selected from among Si, Al, Ti, Ta, W, Mo, and Zr.

The insulating film 1 is formed through CVD, sputtering, or ALD. The insulating film 1 contains a 1 wt % or less transition metal, such as Cu, and 1 wt % or less In. It is noted that the metal contained in the insulating film 1 may be Cu only, which is a transition metal.

As illustrated in FIG. 2, the cap layer 11 may be disposed between the barrier layer 6 and the Schottky electrode 3.

Figure 3:
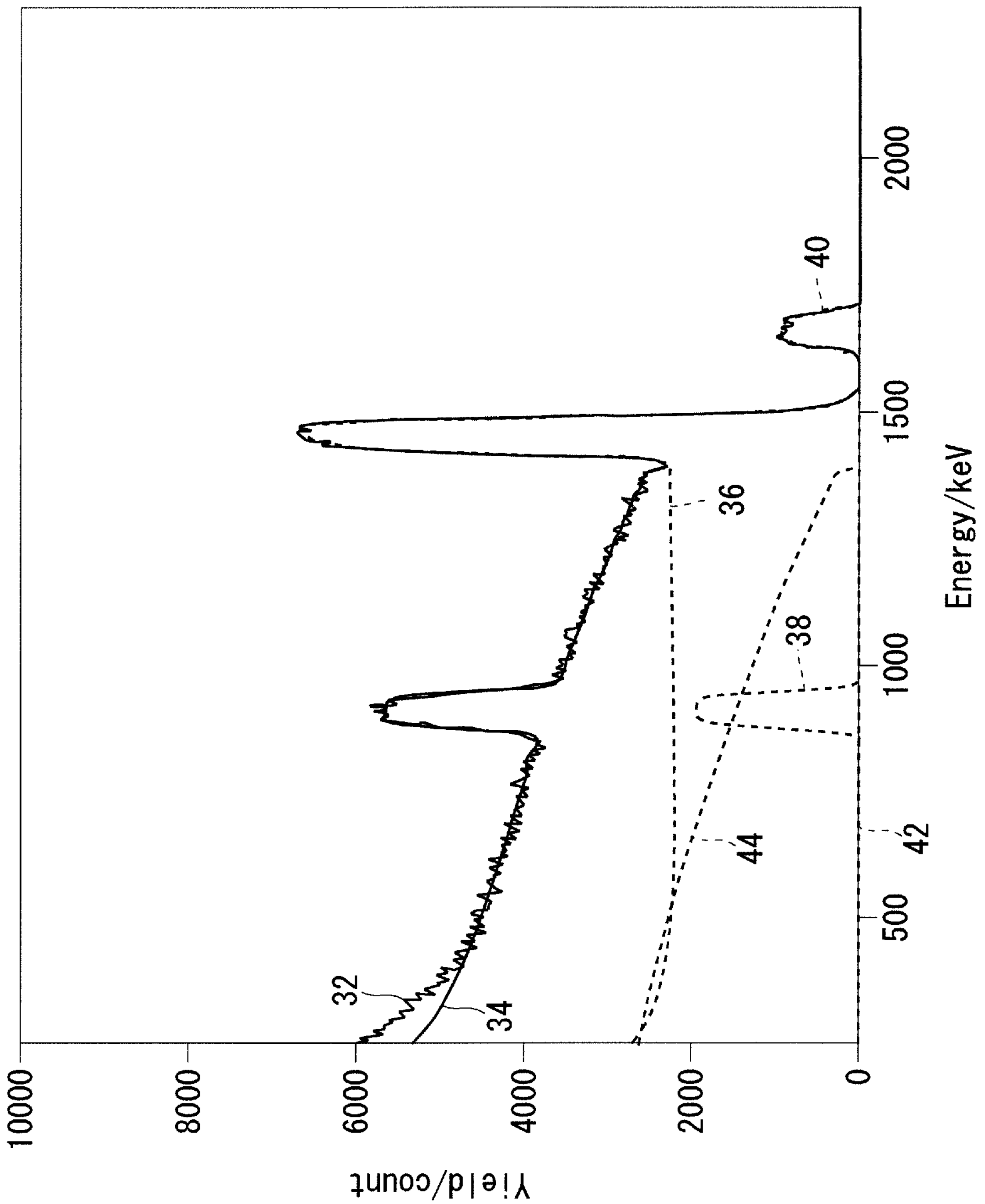
FIG. 3 is a graph illustrating the results of analysis of a component that includes an insulating film containing no transition metal, according to the embodiment. The analysis is conducted through Rutherford backscattering spectrometry.
Figure 4:
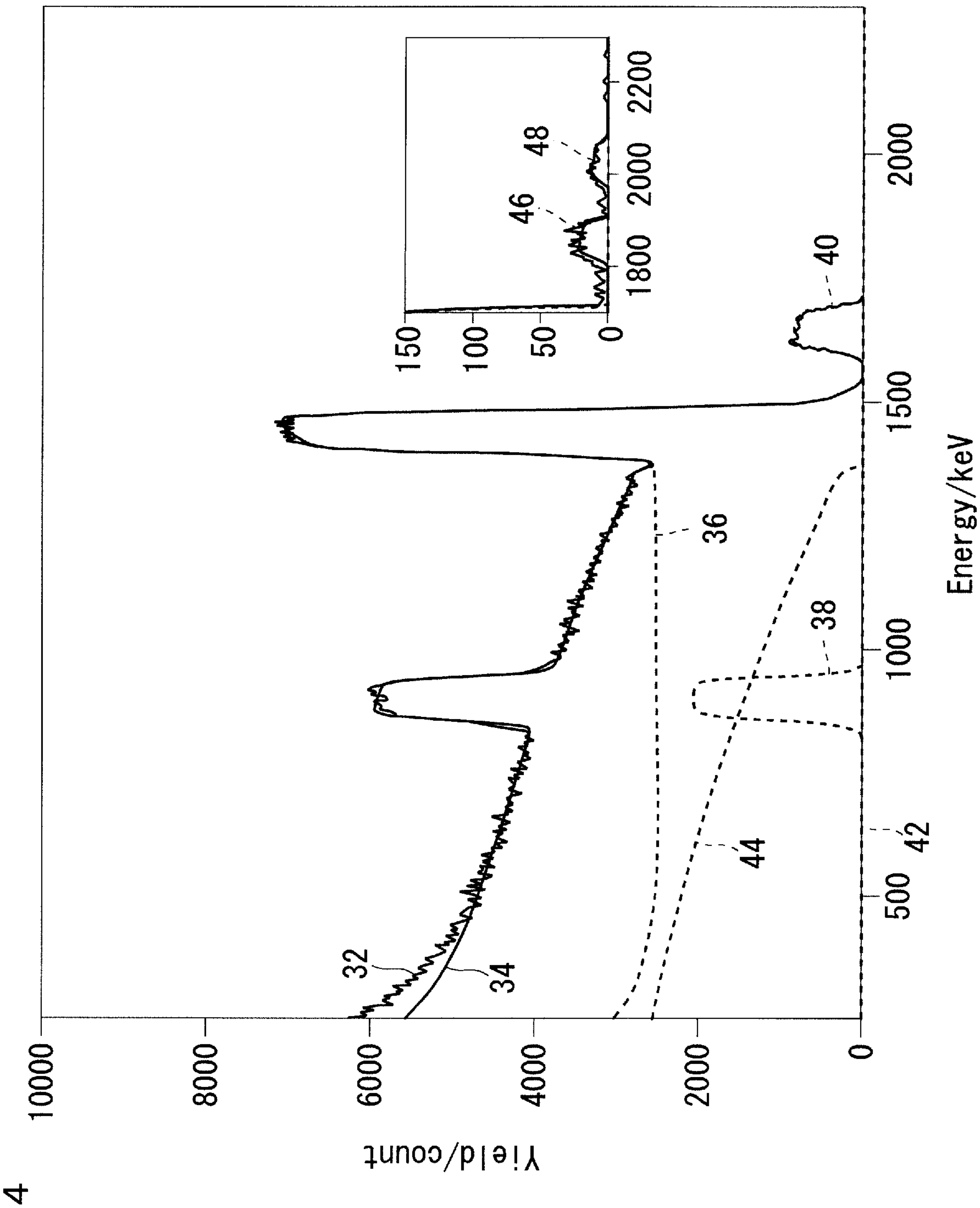
FIG. 4 is a graph illustrating the results of analysis of a component that includes an insulating film containing 1 wt % or less In and 1 wt % or less Cu (i.e., a transition metal), according to the embodiment. The analysis is conducted through RBS.

FIG. 3 is a graph illustrating the results of analysis of a component that includes an insulating film containing no transition metal. This analysis was conducted through Rutherford backscattering spectrometry (RBS). FIG. 4 is a graph illustrating the results of analysis of a component that includes the insulating film 1 containing 1 wt % or less In and 1 wt % or less Cu, which is a transition metal. This analysis was conducted through RBS.

With reference to FIGS. 3 and 4, the results of the RBS analysis of the component that includes the insulating film 1 containing 1 wt % or less In and 1 wt % or less Cu, which is a transition metal, are compared with the results of the RBS analysis of the component that includes the insulating film containing no transition metal.

In the graph of each of FIGS. 3 and 4, the lateral axis indicates energy [keV] at the time of backscattering; and the vertical axis, corresponding yield. The graph of each of FIGS. 3 and 4 shows a measurement value 32 (solid line), an entire simulation value 34 (solid line), a simulation value 36 of Si (dotted line), a simulation value 38 of N (dotted line), a simulation value 40 of Ar (dotted line), a simulation value 42 of C (dotted line), and a correction line 44 (dotted line). The graph of FIG. 4 shows a simulation value 46 of Cu (dotted line) and a simulation value 48 of In (dotted line). Both insulating films used herein are formed by electron cyclotron resonance (ECR).

The comparison between FIGS. 3 and 4 has revealed that in FIG. 4, backscattered In and backscattered Cu, which is a transition metal, have their respective peaks at around 1800 keV to around 2100 keV.

The insulating film 2 needs to be an oxide or nitride containing one of elements selected from among Si, Al, Ti, Ta, W, Mo, and Zr. As is the case with the insulating film 1, the gate protective film 2 is formed through CVD, sputtering, or ALD.

With the aforementioned configuration, the transition metal contained in the insulating film 1 forms surface defects and levels at the interface between a group III-V semiconductor (e.g., $Al_{1-x}Ga_xN$ constituting the barrier layer 6, where x is equal to or smaller than one, or GaN constituting the cap layer 11) and the insulating film 1, and within the insulating film 1 near the interface. Holes or electrons are then trapped in the formed surface defects and levels, thereby reducing a gate leakage current caused by a tunnel current and other factors.

The aforementioned configuration improves an OFF breakdown voltage in the operation of the transistor when compared to a conventional structure.

Figure 5:
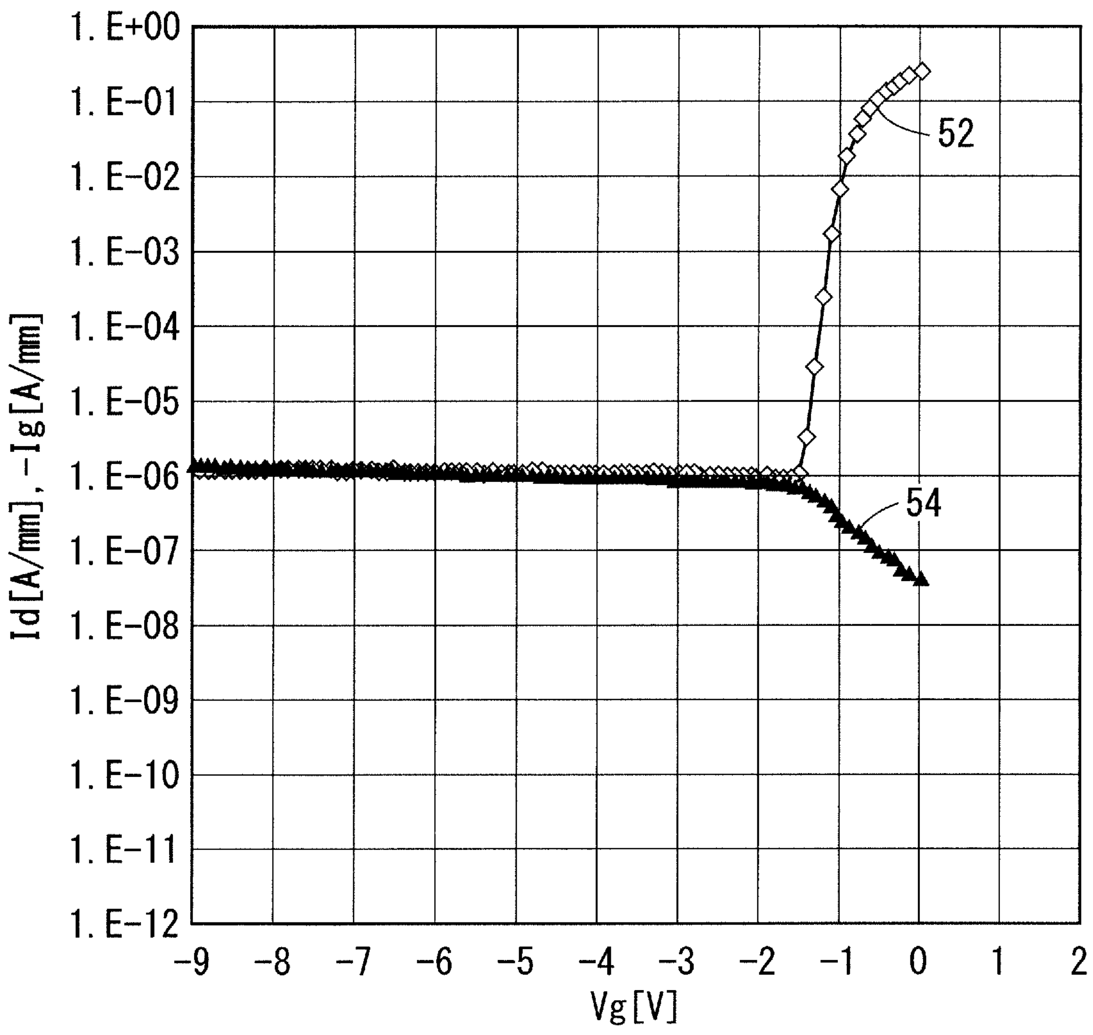
FIG. 5 is a graph illustrating a drain current (Id)-gate voltage (Vg) characteristic and a gate current (Ig)-gate voltage (Vg) characteristic, in the use of a component that includes an insulating film containing no transition metal, according to the embodiment.
Figure 6:
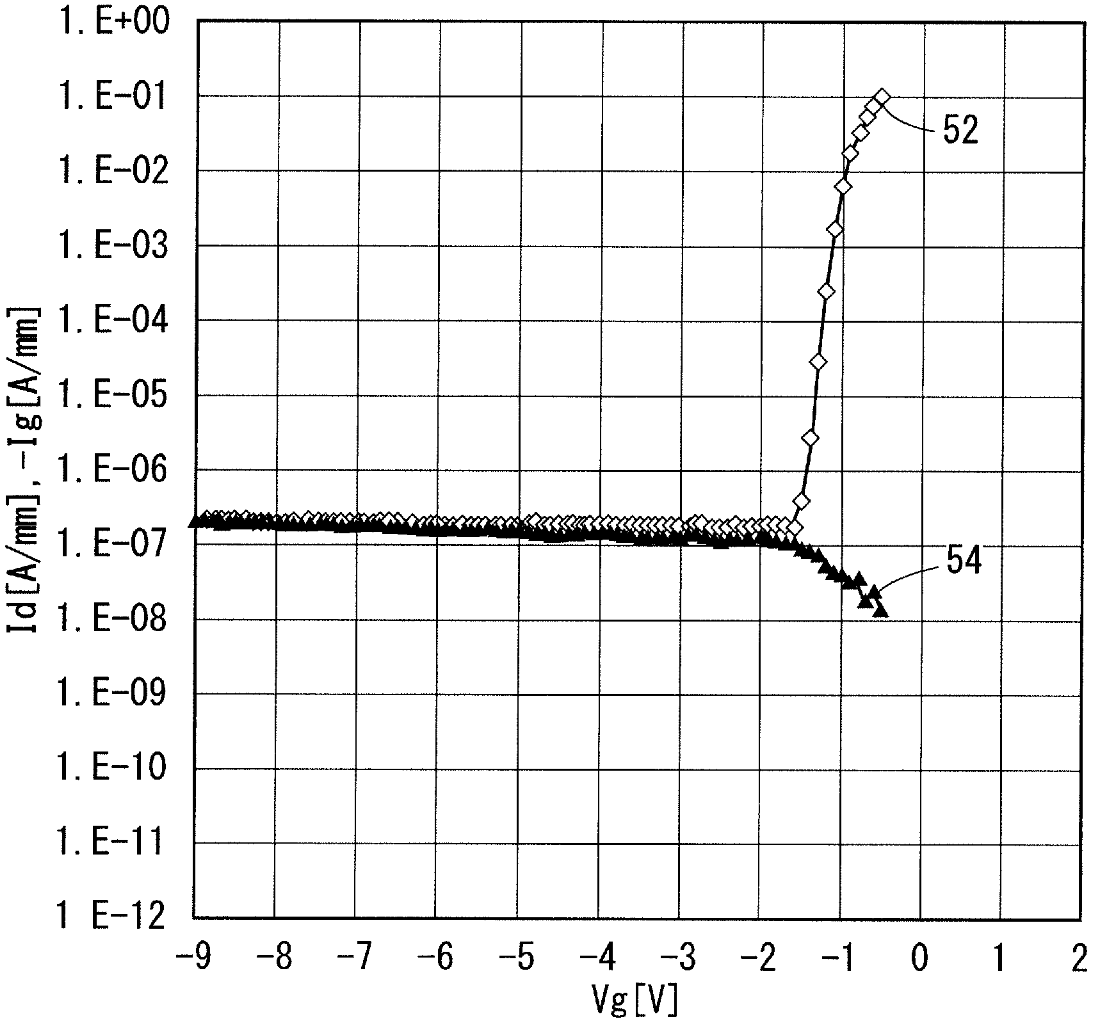
FIG. 6 is a graph illustrating a drain current (Id)-gate voltage (Vg) characteristic and a gate current (Ig)-gate voltage (Vg) characteristic, in the use of a component that includes an insulating film containing 1 wt % or less In and 1 wt % or less Cu (i.e., a transition metal).

FIG. 5 is a graph illustrating a drain current (Id)-gate voltage (Vg) characteristic and a gate current (Ig)-gate voltage (Vg) characteristic, in the use of a component that includes an insulating film containing no transition metal. FIG. 6 is a graph illustrating a drain current (Id)-gate voltage (Vg) characteristic and a gate current (Ig)-gate voltage (Vg) characteristic, in the use of a component that includes the insulating film 1 containing 1 wt % or less In and 1 wt % or less Cu, which is a transition metal.

In the graph of each of FIGS. 5 and 6, the vertical axis indicates drain current (Id) and gate current (−Ig) [A/mm]; and the lateral axis, gate voltage [V]. The graph of each of FIGS. 5 and 6 shows a drain current 52 (rectangle) and a gate current 54 (triangle).

The comparison between FIGS. 5 and 6 has revealed that in FIG. 6, the Id-Vg characteristic and the Ig-Vg characteristic are improved. To be specific, in FIG. 6, a gate current lowers in the OFF state, and a gate leakage current is reduced.

Second Embodiment

The following describes a semiconductor device and a method for manufacturing the semiconductor device, according to a second embodiment. Like components between the present embodiment and the previous embodiment are denoted by the same signs, and the details of the like elements will not be elaborated upon.

<Method for Manufacturing Semiconductor Device>

Before or after formed, the insulating film 1 in FIGS. 1 and 2 may undergo application of a solution containing a transition metal by the use of, for instance, a spin coater, and undergo thermal diffusion. A thermal diffusion method after the formation of the insulating film 1 may be performed after the Schottky electrode 3 (i.e., gate electrode) is formed.

Forming the insulating film 1 through the aforementioned process enables the semiconductor device according to the present embodiment to achieve action and effect equal to those achieved in the first embodiment.

A transition metal can be added to the insulating film 1 when the insulating film 1 is formed through sputtering, CVD, or ALD.

On the other hand, transition-metal doping is also possible after the insulating film 1 is formed and after the Schottky electrode 3 is formed. Such a process prevents a transition metal from entering the barrier layer 6 or cap layer 11 directly under the Schottky electrode 3, which is a gate electrode. This maintains a good Schottky characteristic.

Third Embodiment

The following describes a semiconductor device and a method for manufacturing the semiconductor device, according to a third embodiment. Like components between the present embodiment and the previous embodiments are denoted by the same signs, and the details of the like elements will not be elaborated upon.

<Configuration of Semiconductor Device>

Figure 7:
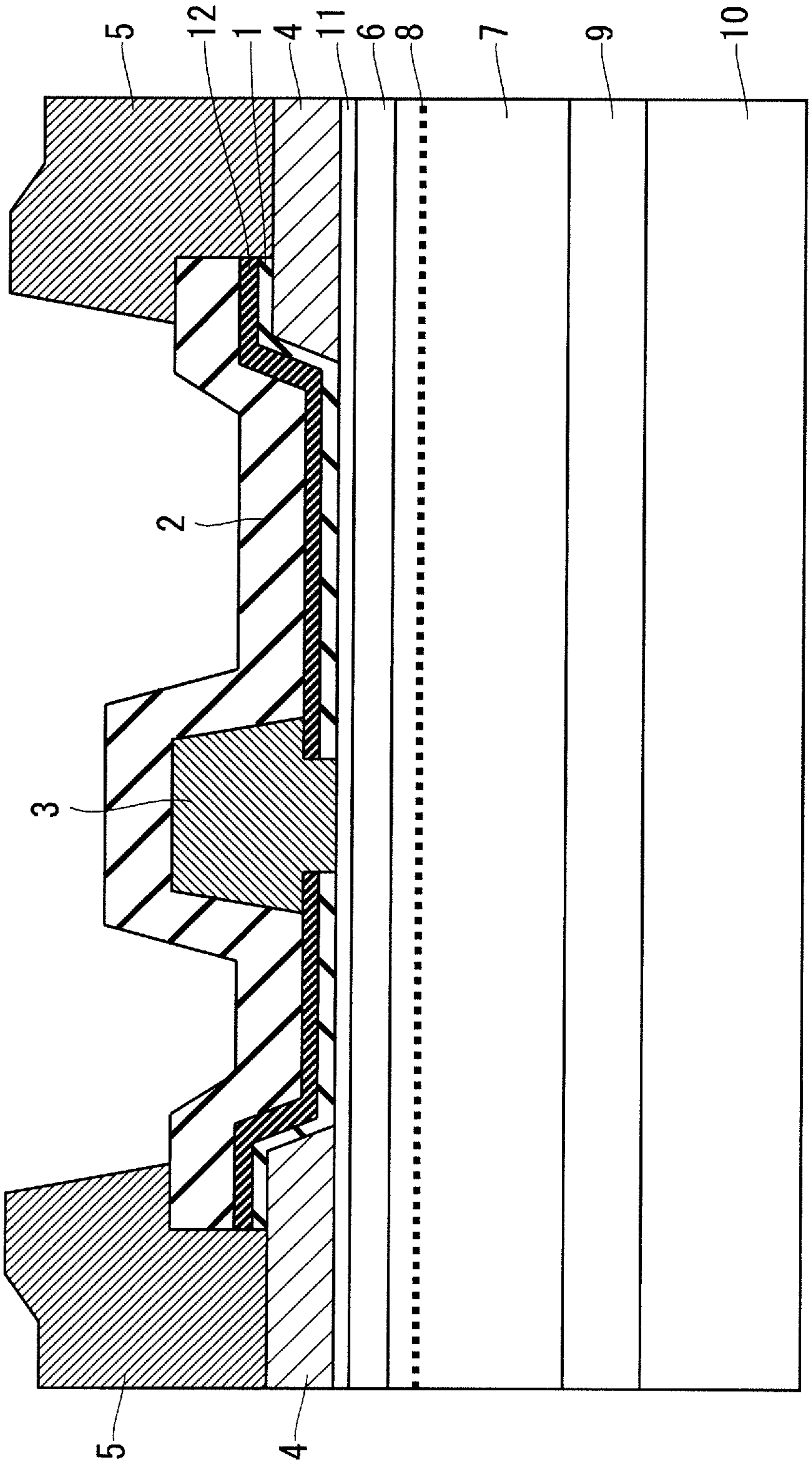
FIG. 7 is a schematic cross-sectional view of the configuration of a field-effect transistor according to an embodiment.

FIG. 7 is a schematic cross-sectional view of the configuration of a field-effect transistor according to the present embodiment. As illustrated in FIG. 7, an insulating film 12 is disposed on the upper surface of the insulating film 1. The insulating film 12 is a laminated film and is identical to or different from the insulating film 1. The structure in FIG. 7 includes the cap layer 11 as well.

As illustrated in FIG. 7, the field-effect transistor includes the semiconductor substrate 10, the buffer layer 9, the channel layer 7, the barrier layer 6, the cap layer 11, the plurality of ohmic electrodes 4, the insulating film 1, the insulating film 12, the Schottky electrode 3, the gate protective film 2, and the wiring electrode 5.

As illustrated in FIG. 7, the barrier layer 6 is disposed on the upper surface of the channel layer 7. The cap layer 11 of GaN is disposed on the upper surface of the barrier layer 6.

Each of the ohmic electrodes 4 is partly disposed on the upper surface of the cap layer 11. The insulating film 1 extends over the upper surface of the cap layer 11 and the upper surface of each ohmic electrode 4, and is partly disposed on the upper surface of the barrier layer 6. The insulating film 12 is disposed over the insulating film 1.

The Schottky electrode 3 is partly provided to extend over the upper surface of the insulating film 12 and the upper surface of the cap layer 11. The lower surface of the Schottky electrode 3 is provided to be at least partly in contact with the upper surface of the cap layer 11 that is exposed without being covered with the insulating films 1 and 12. Here, the Schottky electrode 3 may be provided to cover only the upper surface of the cap layer 11. In other words, the Schottky electrode 3 does not have to be disposed on the upper surface of the insulating film 12.

Here, the insulating film 1 is provided so as to be in contact with part of the side surfaces of the Schottky electrode 3 and with the cap layer 11.

The gate protective film 2 is provided to extend over the upper surface of the insulating film 12 and the upper surface of the Schottky electrode 3. The wiring electrode 5 is partly provided to extend over the upper surface of the gate protective film 2 and the upper surface of the ohmic electrode 4.

There are no films, such as an insulating film, disposed immediately under the Schottky electrode 3. The Schottky electrode 3, which is a gate electrode, is disposed immediately on the cap layer 11. In the configuration illustrated in FIG. 7, the insulating films 1 and 12 are interposed between part of the Schottky electrode 3 and part of the cap layer 11.

The semiconductor device according to the present embodiment, which includes the insulating film 12, enhances an effect of reducing an electric field applied to the Schottky electrode 3, which is a gate electrode. A gate leakage current is consequently reduced.

The insulating film 12 is disposed between the insulating film 1, containing a transition metal, and the gate protective film 2. This prevents a transition metal from entering the gate protective film 2. Consequently, improvements in moisture resistance and other things are obtained as well.

<Effect of Aforementioned Embodiments>

The following describes an effect of the aforementioned embodiments by way of example. Although these effects are based on the specific configurations described in the aforementioned embodiments, these specific configurations may be replaced with any other specific embodiment described in the Description within a range in which like effects are obtained.

The replacement may be done among multiple embodiments. That is, configurations illustrated in different embodiments may be combined, thus obtaining like effects.

The semiconductor device according to the aforementioned embodiment includes a nitride semiconductor layer, a first insulating film, and a gate electrode. Here, the nitride semiconductor layer corresponds to the barrier layer 6 for instance. Moreover, the first insulating film corresponds to the insulating film 1 for instance. Moreover, the gate electrode corresponds to the Schottky electrode 3 for instance. The insulating film 1 is partly disposed on the upper surface of the barrier layer 6. The lower surface of the Schottky electrode 3 is provided to be at least partly in contact with the upper surface of the barrier layer 6 that is exposed without being covered with the insulating film 1. Here, the insulating film 1 is provided to be in contact with a side surface of the Schottky electrode 3. Moreover, the insulating film 1 contains a transition metal.

Such a configuration reduces a gate leakage current without degrading a high-frequency characteristic. To be specific, the transition metal contained in the insulating film 1 forms surface defects and levels at the interface between a group III-V semiconductor (e.g., $Al_{1-x}Ga_xN$ constituting the barrier layer 6, where x is equal to or smaller than one, or GaN constituting the cap layer 11) and the insulating film 1, and within the insulating film 1 near the interface. Holes or electrons are then trapped in the formed surface defects and levels, thereby reducing a gate leakage current.

The configurations illustrated in the Description other than these configurations can be omitted as necessary. That is, a semiconductor device having at least these configurations can bring the aforementioned effect.

However, in some cases, the above configurations additionally include at least one of other configurations described in the Description as necessary; that is, in some cases, the above configurations additionally include other configurations described in the Description that are not mentioned herein. Such additionally included configurations can bring the aforementioned effect similarly.

According to the aforementioned embodiment, the insulating film 1 contains a 1 wt % or less transition metal. With such a configuration, the transition metal contained in the insulating film 1 forms surface defects and levels at the interface between a group III-V semiconductor and the insulating film 1, and within the insulating film 1 near the interface.

According to the aforementioned embodiment, the insulating film 1 contains at least one of Cu, Ni, Zn, Fe, Cr, and Ti as a transition metal. With such a configuration, the transition metal contained in the insulating film 1 forms surface defects and levels at the interface between a group III-V semiconductor and the insulating film 1, and within the insulating film 1 near the interface. Holes or electrons are then trapped in the formed surface defects and levels, thereby reducing a gate leakage current.

According to the aforementioned embodiment, the insulating film 1 further contains In. With such a configuration, the transition metal and In contained in the insulating film 1 forms surface defects and levels at the interface between a group III-V semiconductor and the insulating film 1, and within the insulating film 1 near the interface.

According to the aforementioned embodiment, the insulating film 1 is an oxide or nitride containing at least one of elements selected from among Si, Al, Ti, Ta, W, Mo, and Zr. With such a configuration, the transition metal contained in the insulating film 1 forms surface defects and levels at the interface between a group III-V semiconductor and the insulating film 1, and within the insulating film 1 near the interface.

According to the aforementioned embodiment, the semiconductor device includes the cap layer 11 made of GaN. The cap layer 11 is disposed on the upper surface of the barrier layer 6. The semiconductor device is configured such that the insulating film 1 is partly disposed on the upper surface of the cap layer 11. The semiconductor device is also configured such that the lower surface of the Schottky electrode 3 is provided to be at least partly in contact with the upper surface of the cap layer 11 that is exposed without being covered with the insulating film 1. With such a configuration, the transition metal contained in the insulating film 1 forms surface defects and levels at the interface between a group III-V semiconductor and the insulating film 1, and within the insulating film 1 near the interface. Holes or electrons are then trapped in the formed surface defects and levels, thereby reducing a gate leakage current.

According to the aforementioned embodiment, the semiconductor device includes a second insulating film disposed over the insulating film 1. Here, the second insulating film corresponds to the insulating film 12 for instance. The semiconductor device is configured such that the lower surface of the Schottky electrode 3 is provided to be at least partly in contact with the upper surface of the barrier layer 6 or cap layer 11 that is exposed without being covered with the insulating films 1 and 12. The semiconductor device, which includes the insulating film 12, enhances an effect of reducing an electric field applied to the Schottky electrode 3, which is a gate electrode. A gate leakage current is consequently reduced. The insulating film 12 is disposed between the insulating film 1, containing a transition metal, and the gate protective film 2. This prevents a transition metal from entering the gate protective film 2. Consequently, improvements in moisture resistance and other things are obtained as well.

The method for manufacturing a semiconductor device according to the aforementioned embodiment includes epitaxial-growing the barrier layer 6 on the semiconductor substrate 10. The method also includes partly forming the insulating film 1 on the upper surface of the barrier layer 6. The method also includes forming the Schottky electrode 3 in such a manner that the lower surface of the Schottky electrode 3 is at least partly in contact with the upper surface of the barrier layer 6 that is exposed without being covered with the insulating film 1, and in such a manner that a side surface of the Schottky electrode 3 is in contact with the insulating film 1. The method also includes adding a transition metal to the insulating film 1.

Such a configuration reduces a gate leakage current without degrading a high-frequency characteristic. To be specific, the transition metal contained in the insulating film 1 forms surface defects and levels at the interface between a group III-V semiconductor (e.g., $Al_{1-x}Ga_xN$, where x is equal to or smaller than one, or GaN) and the insulating film 1, and within the insulating film 1 near the interface. Holes or electrons are then trapped in the formed surface defects and levels, thereby reducing a gate leakage current.

The configurations described in the Description other than these configurations can be omitted as necessary. That is, a semiconductor device having at least these configurations can bring the aforementioned effect.

However, in some cases, the above configurations additionally include at least one of other configurations illustrated in the Description as necessary; that is, in some cases, the above configurations additionally include other configurations described in the Description that are not mentioned herein. Such additionally included configurations can bring the aforementioned effect similarly.

Unless otherwise limited, individual process steps are performed in changeable order.

According to the aforementioned embodiment, the method for manufacturing the semiconductor device is configured such that a transition metal is added to the insulating film 1 after the Schottky electrode 3 is formed. Such a configuration prevents a transition metal from entering the barrier layer 6 or cap layer 11 directly under the Schottky electrode 3, which is a gate electrode. This maintains a good Schottky characteristic.

According to the aforementioned embodiment, the method is also configured such that a transition metal can be added to the insulating film 1 when the insulating film 1 is formed through sputtering, CVD, or ALD. With such a configuration, the transition metal contained in the insulating film 1 forms surface defects and levels at the interface between a group III-V semiconductor and the insulating film 1, and within the insulating film 1 near the interface. Holes or electrons are then trapped in the formed surface defects and levels, thereby reducing a gate leakage current.

According to the aforementioned embodiment, the method is configured such that a transition metal is added to the insulating film 1 through application of a solution containing a transition metal and through thermal diffusion. With such a configuration, the transition metal contained in the insulating film 1 forms surface defects and levels at the interface between a group III-V semiconductor and the insulating film 1, and within the insulating film 1 near the interface. Holes or electrons are then trapped in the formed surface defects and levels, thereby reducing a gate leakage current.

<Modifications of Aforementioned Embodiments>

In some cases, the aforementioned embodiments describe the material quality, material, size, and shape of each component, the relative arrangement relationship between the components, conditions for implementation, and other things. They are illustrative in all aspects and are thus not limited to what is described in the Description.

Accordingly, numerous variations and equivalents that are not illustrated herein can be assumed within the scope of the technique disclosed in the Description. For instance, at least one component can be modified, added, or omitted. Furthermore, at least one component can be extracted from at least one embodiment, thus being combined with a component in another embodiment.

Unless otherwise contradicted, the components that are described in the aforementioned embodiments in such a manner that "one component" is provided, may be formed of "one or more" components.

Furthermore, the individual components in the aforementioned embodiments are conceptual units. Thus, within the scope of the technique disclosed in the Description, one component can be formed of multiple structures, one component can correspond to part of a certain structure having one component, and multiple components can be included in one structure.

Each component in the aforementioned embodiments includes a structure having another structure or shape as long as it exerts the same function.

What are described in the Description are all referred for purposes relating to the present technique. It is thus not an admission that any of the descriptions provided herein are conventional arts.

When the aforementioned embodiments recite a material name that is not particularly specified, it is to be understood that an example of the material is an alloy containing other additives in the material unless otherwise contradicted.

EXPLANATION OF REFERENCE SIGNS

1, 12 insulating film, 2 gate protective film, 3 Schottky electrode, 4 ohmic electrode, 5 wiring electrode, 6 barrier layer, 7 channel layer, 8 two-dimensional electron gas layer, 9 buffer layer, 10 semiconductor substrate, 11 cap layer, 32 measurement value, 34, 36, 38, 40, 42 simulation value, 44 correction line, 52 drain current, 54 gate current.

The invention claimed is:

1. A method for manufacturing a semiconductor device, comprising:

epitaxial-growing a nitride semiconductor layer on a semiconductor substrate;

partly forming a first insulating film on an upper surface of the nitride semiconductor layer;

forming a gate electrode in such a manner that a lower surface of the gate electrode is at least partly in contact with the upper surface of the nitride semiconductor layer that is exposed without being covered with the first insulating film, and in such a manner that a side surface of the gate electrode is in contact with the first insulating film, and the first insulating film including a portion that extends over the nitride semiconductor layer without the gate electrode overlapping an upper surface thereof;

adding a transition metal to the first insulating film; and adding the transition metal to the first insulating film including the portion that extends over the nitride semiconductor layer after forming the gate electrode.

2. A method for manufacturing a semiconductor device, comprising:

epitaxial-growing a nitride semiconductor layer on a semiconductor substrate;

partly forming a first insulating film on an upper surface of the nitride semiconductor layer;

forming a gate electrode in such a manner that a lower surface of the gate electrode is at least partly in contact with the upper surface of the nitride semiconductor layer that is exposed without being covered with the first insulating film, and in such a manner that a side surface of the gate electrode is in contact with the first insulating film;

adding a transition metal to the first insulating film; and adding the transition metal to the first insulating film through application of a solution containing a transition metal and through thermal diffusion.

* * * * *